US008466663B2

(12) United States Patent
Kaufmann

(10) Patent No.: US 8,466,663 B2
(45) Date of Patent: Jun. 18, 2013

(54) METHOD AND POWER SUPPLY SYSTEM FOR PREVENTING FUNCTIONAL IMPAIRING TRANSIENT NOISE WITHIN HIGH FREQUENCY OPERATED INTEGRATED CIRCUITS

(75) Inventor: Michael Kaufmann, Kempten (DE)

(73) Assignee: MK-Elektronik-GmbH, Fellheim (DE)

( * ) Notice: Subject to any disclaimer, the term of this patent is extended or adjusted under 35 U.S.C. 154(b) by 339 days.

(21) Appl. No.: 11/665,701

(22) PCT Filed: Oct. 13, 2005

(86) PCT No.: PCT/DE2005/001831
§ 371 (c)(1),
(2), (4) Date: Apr. 18, 2007

(87) PCT Pub. No.: WO2006/042513
PCT Pub. Date: Apr. 27, 2006

(65) Prior Publication Data
US 2009/0046484 A1    Feb. 19, 2009

(30) Foreign Application Priority Data

Oct. 18, 2004   (DE) .......................... 10 2004 050 665

(51) Int. Cl.
*G05F 1/00*   (2006.01)

(52) U.S. Cl.
USPC ........................................... 323/220; 363/26

(58) Field of Classification Search
USPC .............. 363/24–26, 39, 40, 44, 45; 323/220
See application file for complete search history.

(56) References Cited

U.S. PATENT DOCUMENTS

| | | | |
|---|---|---|---|
| 6,310,792 B1 * | 10/2001 | Drobnik ........................ | 363/147 |
| 6,472,855 B2 | 10/2002 | Ball .............................. | 323/282 |
| 6,768,616 B2 * | 7/2004 | Mergens et al. ................ | 361/56 |
| 6,775,160 B2 * | 8/2004 | Siri ................................ | 363/89 |
| 2002/0171985 A1 * | 11/2002 | Duffy et al. .................... | 361/90 |
| 2003/0039092 A1 | 2/2003 | Kanouda et al. .............. | 361/502 |
| 2004/0146101 A1 * | 7/2004 | Pearce ........................... | 375/238 |
| 2004/0174147 A1 | 9/2004 | Vinciarelli .................... | 323/266 |
| 2004/0233686 A1 * | 11/2004 | Li et al. .......................... | 363/71 |
| 2005/0041439 A1 * | 2/2005 | Jang et al. ....................... | 363/17 |
| 2005/0248963 A1 * | 11/2005 | Cheng ............................ | 363/17 |

* cited by examiner

*Primary Examiner* — Harry Behm
*Assistant Examiner* — Matthew Grubb
(74) *Attorney, Agent, or Firm* — Jacobson Holman PLLC

(57) ABSTRACT

According to prior art, a clock frequency increase for clocked high-frequency integrated circuits, in particular microprocessors, reaches a current physical limit of approximately 3 GHz, as dynamic current modifications cannot be sufficiently compensated. The aim of the invention is to provide a power supply for electronic systems with a double-figure GHz range. To permit the rapid compensation of dynamic current modifications, the current compensation circuit (10) is placed in the vicinity of the integrated circuit (11) or is integrated into the latter. A control amplifier (8) influences a pulsewidth modulator (2) by means of an optical coupler (9). Said pulsewidth modulator control controls a normal mode voltage converter (3, 4) with synchronous rectification (5). A specific application area for the invention is the supply of future high-performance microprocessors, whose development has been delayed by the aforementioned power problem.

10 Claims, 2 Drawing Sheets

Figure 1:
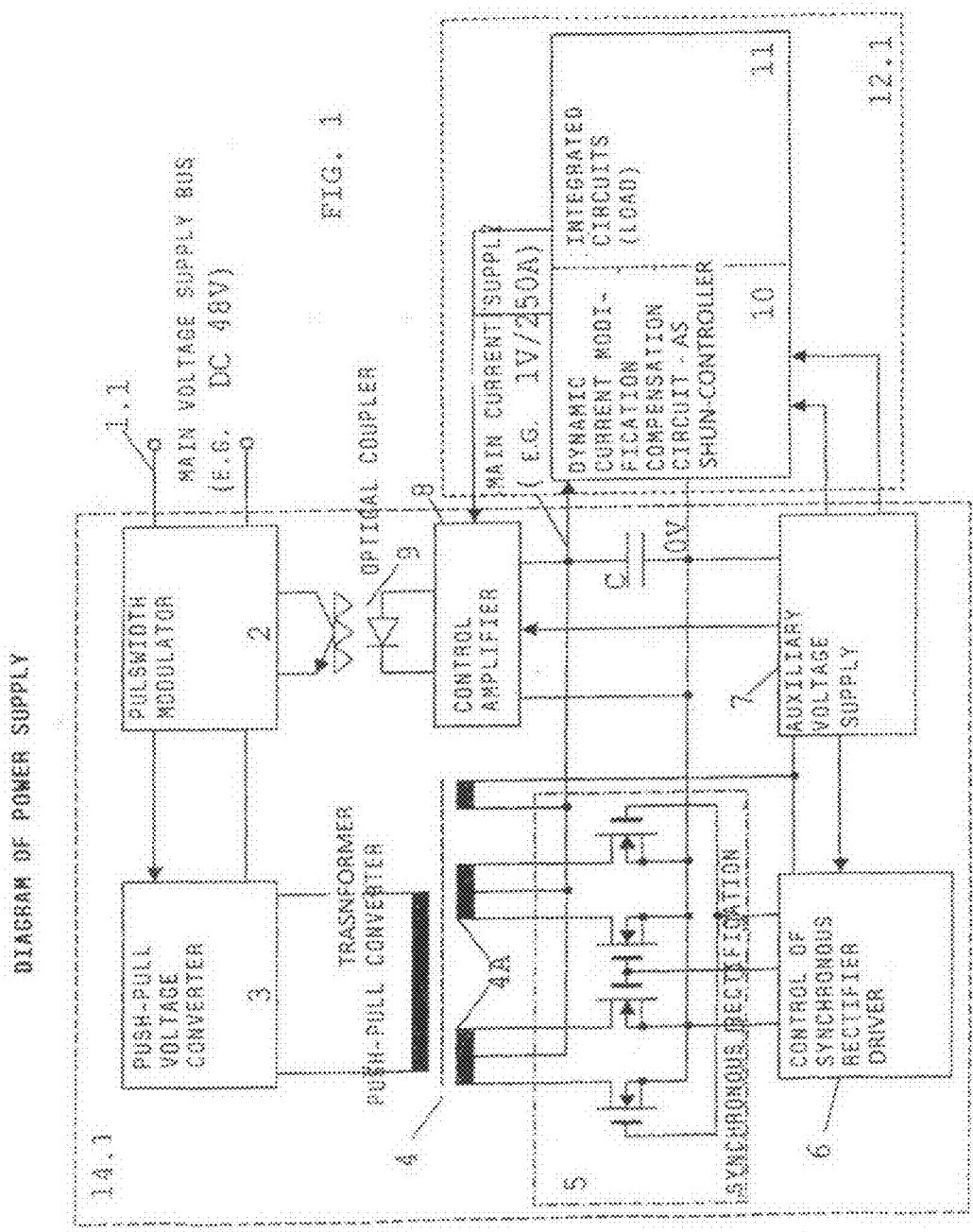

METHOD AND POWER SUPPLY SYSTEM FOR PREVENTING FUNCTIONAL IMPAIRING TRANSIENT NOISE WITHIN HIGH FREQUENCY OPERATED INTEGRATED CIRCUITS

This is a national stage of PCT/DE2005/001831 filed 13 Oct. 2005 and published in German.

The invention refers to a power supply for electronic systems for electronic circuits with high operational frequency. In the recent decades the computing performance of computers doubled according to "Moore's Law" each time at an average of one and a half years. This increase of performance was reached by semiconductor structures which became smaller and smaller, subsequently increasing integration density and the continuous acceleration of the clock frequency which became possible through that. The effect for the power supply of these systems was a step-by-step reduction of the operating voltage while the operating current increased accordingly. In addition to the increase of the control accuracy necessary because of that together with the clock frequency the dynamic requirements of the power supply increased considerably.

In present high performance processors, operating at about 2 to 3 GHz clock frequency, the operating voltage may not exceed more than ±5% (about ±0.05 to 0.075 V) when the dynamic load current modifications are about 350 A/μs so that a proper function of the processor is not impaired.

If the main feed lines have a length of only about 1.5 cm and a width of 1 cm and a conductor spacing of 1.5 mm (double-laminated circuit board) the result will be a conduction inductance of about 3 nH. A dynamic current modification of 350 A/μs thus induces at the main feed line already spikes of about ±1 V, that means about ±70% of the operating voltage at $U_B=1.5$ V.

In the present state of the art they try to solve these dynamic requirements with point-of-load-DC/DC-converters with high operating frequency—in actual variation carried out as polyphase step-down converter with synchronous rectification and digital phase control and adjustment—as well as a larger number of supporting capacitors distributed across the chip area, a high number of main feed contacts distributed across the entire processor chip minimising the main feed inductance.

In order to be able to replace highly capacitive supporting capacitors with a small number of small capacitors with lower ESR and smaller inductance also DRC circuits (dynamic load transient response circuit), e.g. by Ericsson or according U.S. Pat. No. 6,472,855B2, are used.

Despite the application of such techniques the efforts to further accelerate the clock rate have reached a physical limit (called a "power problem" in professional papers). The CPU clock frequency of 15 GHz, still predicted in December 2003 for 2005, seems unachievable according to the present state of the art. Additional design measurements on chip level, like X architecture, the division into several power supply regions connected with outer supporting capacitors, and other measurements could only reach a clock frequency of about 4 GHz as superior limit frequency which could not even be exceeded by other structure reductions.

Neither the transistor cells limit frequencies of more than 70 GHz, achievable already with structural widths of 90 nm, nor the possible thermal carrying-off of heat of 1 kW/cm² (at $\Delta T \approx 5°$ C. between chip and steam temperature) with have reached their limits according to the present state of the art.

Causes of trouble for uncontrolled system crashes, when the presently possible clock rates are exceeded, are the operating voltage peaks (transients) proportional to the clock frequency and to the operating current which, despite a relatively high number of supporting capacitors bonded at the chip, considerably exceed or fall below starting with a certain clock frequency the still safe operating voltage region of ±10%. The dynamic modifications of the operating current, caused by bit parity fluctuations (parity noise) depending on software and data flow, with the clock frequency which generate these current spikes at inductance and ESR of the supporting capacitors.

Arithmetic Example

With the operating data of a typical processor, 1.5 V operating voltage $U_B$ at 40 A power consumption, 2 GHz clock frequency, 20 supporting capacitors size 1210 (3.2×2.4×2.5 mm):

40 A/20→2A/capacitor→with 1% current noise with 0.25 ns pulse width a dynamic current modification of ±0.02 A/0.25 ns≈±8×10⁷ A/s at the supporting capacitor is the result.

With a middle capacitor spacing of 2.5 mm/2+0.25 mm from the chip the inductance formed with the chip can be assessed with the formula $L_c=\mu_0 \cdot A/l$:

$$L_c = \mu_0 \cdot 1.5 \text{ mm} \cdot 2.5 \text{ mm}/2.5 \text{ mm} \approx 1.9 \text{ nH}$$

Thus the voltage induced at this inductance by current noise is:

$$\pm 8 \cdot 10^7 \text{ A/s} \cdot 1.9 \text{ nH} \approx \pm 0.15 \text{ V}$$

This value corresponds with the operating voltage peaks of ±10% $U_B$ just allowed for a fault free operation.

In addition to that the problem becomes even worse because with increasing integration density (of 130 nm→90 nm→45 nm structural width, the latter corresponding with the C-Mos gate length) and with increasing operating current the operating voltage has to be reduced from 2 V to 0.9 V, and the number of supporting capacitors can hardly be increased and their size and chip spacing cannot be reduced. This clarifies the barrier generally seen as "physical limit" for a further clock frequency rise.

It is an object of the invention to remedy these disadvantages directly at the point of origin. This problem is solved with a power supply for an electronic system of the type described in the beginning according to the invention in that way that dynamic current modification compensation circuits are placed in the direct vicinity of the points of origin of the current modifications, for example accumulating registers, cache memories, data bus drivers and so on, or are integrated in the integrated circuit itself.

The shifting of the dynamic operating voltage stabilization (by means of current modification compensation circuits) from the millimetre range of the circuit board into the micrometer range of the semiconductor chip level reduces the current line inductance to the load (power consumer circuits) by the same scale factor. When the tolerance width for the operating voltage transient is the same, according to the invention, the clock frequency may be increased theoretically by the reciprocal scale factor.

Simple current modification compensation circuits may here be realised, for example with a few transistors (Miller integrator) capacitively inverse-coupled by the operating voltage, which are connected in parallel to the CPU operating voltage at suited points in or at the semiconductor chip as shunt control. Depending on the application case with about 1 to 10% shunt current (local share of operating current) all occurring dynamic current modifications can be almost completely adjusted to maximum of power and reduced to the main feed lines to the outer power supply to about 1% of the one generated by the IC.

The invention has the advantage that sources of current noise on the main feed lines and at the supporting capacitors cannot induce any more spikes impairing the safe operation. This allows, besides an increase of the clock frequency by approximately factor 10, also a reduction of the number of supporting capacitors and feed voltage conduct contacts to the chip by about 90%, so that the production costs can be lowered considerably and the reliability is improved clearly. The chip architecture may be simplified when the invention is applied so that effort and time for design are reduced considerably.

Program-dependent operating current modifications of about 20% to 110% with maximum 3% of the clock frequency have to be adjusted to maximum of power by the processor main power supply while keeping $U_B \pm 10\%$. In order to comply with these requirements even with clock frequencies of about 25 GHz it becomes necessary to place the main power supply in the shortest possible distance to the micro processor (that means directly above it), and to optimise this further compared with the state of the art. Such a power supply optimised in different sub-functions which makes the synergy effects of these improvements for increase of the efficiency with a considerable rise of the reliability and at the same time reduction of the production costs possible is described in the following embodiments.

An embodiment of the invention is to place the low voltage power supply above the chip carrier of the integrated circuit. The result is that power feed lines which are as short as possible to the integrated circuit make a shortened time for adjustment to maximum power of the supply voltage of the integrated circuit possible. Furthermore it is achieved by that that the previously required space for the power supply on the carrier board of the integrated circuit is no more necessary.

In another embodiment the integrated circuit and low voltage power supply are cooled by a common cooling block. The effect is that the effort for a separate cooling for the power supply is not necessary, and a common excess temperature safety for load and supply becomes possible. In addition to that the cooling block may serve, when designed as mechanic part of the low voltage power supply, also for the main feed line to the consumer.

In another embodiment the control of the low voltage power supply—with or without galvanic separation—is carried out primary before the transformation to the supply voltages of the integrated circuits. By means of that it is achieved that the control can be carried out at primary current reduced by the transformer translation ratio. This reduces the production costs and increases the efficiency of the power supply.

Furthermore it is achieved that previously necessary DC intermediate circuit converter modules now can be saved as the low voltage power supply with galvanic separation can be operated directly at the supply bus (e. g. 48 V).

Furthermore it is achieved that an increase of the supply voltage, hazardous for the integrated circuit, through failure of a synchronous rectifier stage or its control cannot occur anymore according to the invention.

In another embodiment of the invention the leakage inductance of a push-pull converter is used as storage inductance for the low voltage power supply. By means of that according to the state of the art saving of additionally required storage inductance is achieved.

In a further embodiment the primary pulse width modulation frequency is many times the push-pull converter frequency. This achieves that the switch frequency for the synchronous rectifiers is 20 to 50 times below the state of the art, and therefore accordingly lower switch losses occur.

Another embodiment provides that the push-pull secondary windings, each comprising a double winding, are applied on the transformer outer limbs, and are connected in parallel on synchronous rectification. Thus, according to the invention, with the same current load the number of transistors required for synchronous rectification is now half compared with the previous state of the art.

In another embodiment by means of performance overdimensioning the power supply may serve additionally as point-of-load-converter for peripheral circuits. The effect is that no space is required for the power supply of peripheral circuits.

Figure 2:
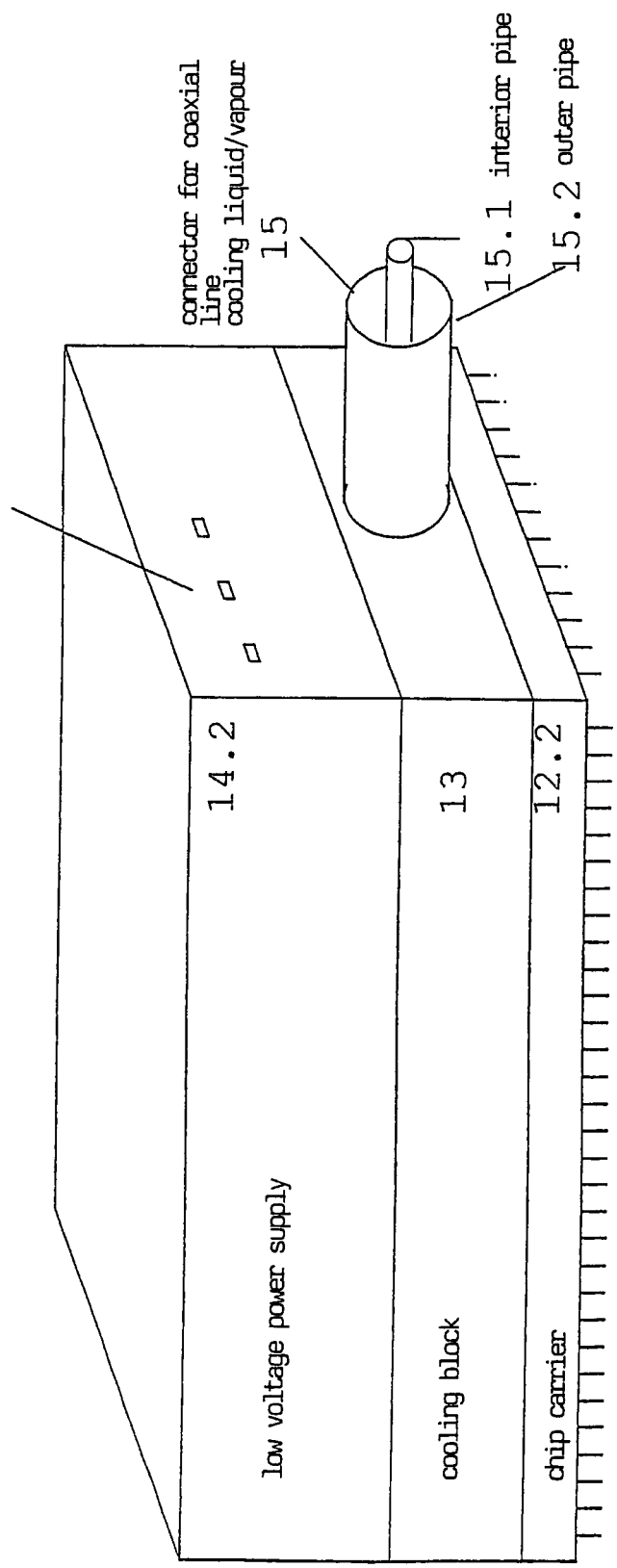

The drawing illustrates basic examples of the invention. In the drawings:

FIG. 1 a block diagram of the power supply for an electronic system with compensation of dynamic current modifications directly at the point of origin, FIG. 2 a basic mechanic structure of the power supply for an electronic system and integrated circuit which has to be fed with common cooling.

A power supply for an electronic system requires a main supply or a supply BUS connection (1.1 or 1.2). The pulse width modulation (2) determines the current consumption of the push-pull voltage converter (3). The push-pull voltage converter (3) forms a square wave voltage of the integrated average value of the pulse width modulation output voltage. By means of the push-pull converter (4) the push-pull output voltage is transformed into the desired main current supply voltage as well as the required auxiliary voltages. In the synchronous rectifier (5) the transformed push-pull voltages for the main current supply are rectified and connected in parallel. The generation of auxiliary voltage (7) is supplied by another secondary winding on the push-pull voltage converter (4). At the same time this secondary winding serves for the control of the synchronous rectifier (6). The control amplifier (8) fed by the auxiliary voltage generator (7) compares the voltage of the main current supply with a built-in reference, and transmits the deviation via an optical coupler (9) to the control of the pulse width modulator (2). The auxiliary voltage supply (7) feeds, beside the main current supply, also the control electronic system of the dynamic current modification compensation circuit (10). By means of that modifications of the voltage at the load (11) are almost completely adjusted to maximum of power.

Temperature safety functions can be realised via a control signal generated by the dynamic current modification compensation circuit (10) or the integrated circuit (11). When a value to be selected below the permissible chip temperature (for example −30K compared with maximal permissible chip temperature) is reached here the control amplifier (8) is activated to reduce main current supply and auxiliary voltages in a controlled manner. With a redundant design the control amplifier (8) may be able to reduce on its own the main current supply and auxiliary voltages when a given temperature is exceeded.

In the mechanic construction a cooling block (13) of electrically and thermally conductive material (for example copper) is applied on the chip carrier (12.2) which has to be through hole plated to the top. This cooling block is segmented in order to make a positive and negative current flow possible, connections for auxiliary voltages are led through the cooling block. The transformer secondary windings for the main current supply are formed by conductive form parts embracing the transformer outer limbs, and connected with segments of the cooling block carrying plus and minus, and serve as carrier of the MOS-FETs of the synchronous rectifier as well as for their heat elimination. Capacitors (C) bridge the segments carrying plus and minus and act as integration capacitors for the power supply (14.1) and as supporting capacitors for the load (11) as well as the dynamic current compensation circuit (10).

Above load (11) and dynamic current modification compensation circuit (10) in the cooling block evaporation chambers for the cooling liquid are arranged which is fed by the interior pipe (15.1) of the coaxial line (15). Cooling liquid in the vapour state may be removed via the outer pipe (15.2).

The invention claimed is:

1. A system, comprising: an electronic power supply providing an operating voltage and integrated into a high frequency operated or clocked integrated circuit, characterized in that:
   the integrated circuit is powered by the operating voltage;
   shunt regulators integrated into the integrated circuit and realized with current change compensating circuits are connected in parallel to the operating voltage within the integrated circuit at the points at which current changes occur; the shunt regulators:
   compensating dynamic current changes generated by the integrated circuit;
   allowing a reduction of supporting capacitors;
   shifting operating voltage stabilization from the millimeter range of the circuit board of the integrated circuit into the micrometer range level of the integrated circuit.

2. The system according to claim 1, comprising a low-voltage power supply.

3. The system according to claim 2, characterized in that the low-voltage power supply is located above a carrier of the integrated circuit in such a distance so that the shortest possible power supply lines to the integrated circuit enable time required to correct the supply voltage to the integrated circuit to be shortened while space requirement on the integrated circuit carrier board for the power supply is eliminated.

4. The system according to claim 2, characterized in that the integrated circuit and the low voltage power supply are cooled by a joint cooling block that is a mechanical part of the low-voltage power supply and acts as a power line to the integrated circuit, carrying support capacitors for the integrated circuit.

5. The system according to claim 2, characterized in that the low-voltage power supply is controlled on the primary side—DC-coupled or decoupled—before transformation to the supply voltage of the integrated circuit in such a manner so that intermediate circuit converter modules can be eliminated.

6. The system according to claim 2, characterized in that leakage inductance of a push-pull converter transformer is used as storage inductance for the low-voltage power supply.

7. The system according to claim 2, characterized in that a switching frequency for synchronous rectifiers is the push-pull converter frequency and about 20 to 50 times lower than primary-side pulse width modulation frequency for supply voltage control.

8. The system according to claim 2, characterized in that, besides reduced space requirements by oversizing the low-voltage power supply output, it supplies the integrated circuit and additional power to peripheral circuits, whereby point-of-load converters and space needed for supplying power to peripheral circuits are eliminated.

9. The system according to claim 2, characterized in that, following enhancements result in synergy:
   a low-voltage power supply is located above the carrier of the integrated circuit in such a distance so that the power supply lines to the integrated circuit enable time required to correct the supply voltage to the integrated circuit to be shortened while space requirements on the integrated circuit carrier board for the power supply is eliminated;
   the integrated circuit and the low-voltage power supply are cooled by a joint cooling block that is a mechanical part of the low-voltage power supply and acts as the power line to the integrated circuit, carrying support capacitors for the integrated circuit;
   the low-voltage power supply is controlled on a primary side—DC-coupled or decoupled—before transformation to the supply voltages of the integrated circuit in such a manner so that intermediate circuit converter modules can be eliminated;
   leakage inductance of a push-pull converter transformer is used as storage inductance for the low-voltage power supply;
   a switching frequency for synchronous rectifiers is the push-pull converter frequency and about 20 to 50 times lower than primary-side pulse width modulation frequency for supply voltage control;
   push-pull secondary windings, consisting of a double winding in each case, are applied to external sides of the transformer and are connected in parallel in synchronous rectification.

10. A power supply arrangement connectable to a high frequency operated or clocked integrated circuit, the power supply arrangement comprising:
   a main power supply arranged completely external to the integrated circuit and arranged to provide a main current supply and a supply voltage for the integrated circuit by way of shortest possible feed lines external to the integrated circuit; and dynamic current modification compensation circuits for compensating for current modifications originating from internal feed lines of the integrated circuit, said dynamic current modification compensation circuits being arranged completely within the integrated circuit and adjacent with distances in micrometer range size of a few transistors in structural width of the integrated circuit to said current modifications to inhibit functional impairing voltage peaks on said internal feed lines, wherein the dynamic current modification compensation circuits are connected in parallel to the supply voltage of the integrated circuit and the dynamic current modification compensation circuits are designed to act as a shunt current control.

\* \* \* \* \*

UNITED STATES PATENT AND TRADEMARK OFFICE
CERTIFICATE OF CORRECTION

PATENT NO.       : 8,466,663 B2                                           Page 1 of 1
APPLICATION NO.  : 11/665701
DATED            : June 18, 2013
INVENTOR(S)      : Michael Kaufmann It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 309 days.

Signed and Sealed this
Eighth Day of September, 2015

Michelle K. Lee
*Director of the United States Patent and Trademark Office*